United States Patent [19]

Nordqvist et al.

[11] Patent Number: 4,642,453
[45] Date of Patent: Feb. 10, 1987

[54] APPARATUS FOR INCREASING THE DYNAMIC RANGE IN AN INTEGRATING OPTOELECTRIC RECEIVER

[75] Inventors: Glenn O. Nordqvist, Solna; Lars-Göte Svenson, Stockholm, both of Sweden

[73] Assignee: Telefonaktiebolaget LM Ericsson, Stockholm, Sweden

[21] Appl. No.: 810,333

[22] PCT Filed: Mar. 26, 1985

[86] PCT No.: PCT/SE85/00133
§ 371 Date: Nov. 8, 1985
§ 102(e) Date: Nov. 8, 1985

[87] PCT Pub. No.: WO85/04773
PCT Pub. Date: Oct. 24, 1985

[30] Foreign Application Priority Data

Apr. 12, 1984 [SE] Sweden ................................ 8402056

[51] Int. Cl.$^4$ ............................................. H01J 40/14
[52] U.S. Cl. .................................. 250/214 A; 330/59; 330/85

[58] Field of Search .............. 330/59, 85, 86, 282, 330/279, 308; 250/214 A, 214 AG; 455/600, 619

[56] References Cited

U.S. PATENT DOCUMENTS 4,574,249  3/1968  Williams ............................ 330/59

FOREIGN PATENT DOCUMENTS 287143  1/1971  U.S.S.R. ............................ 455/619

Primary Examiner—James B. Mullins
Attorney, Agent, or Firm—Roberts, Spiecens & Cohen

[57] ABSTRACT

An apparatus for increasing the dynamic range of an integrating input stage in an optoelectric receiver by means of a feed-back (F2) between the output of an amplifier (F1), associated with the stage, and the pole of an optoelectric converter (D) facing away from the input of the amplifier (F1). The gain of the feed-back can be controlled in response to the luminance with the aid of a transducer (G) connected in series with the converter (D).

4 Claims, 2 Drawing Figures

APPARATUS FOR INCREASING THE DYNAMIC RANGE IN AN INTEGRATING OPTOELECTRIC RECEIVER

BACKGROUND OF THE INVENTION

The present invention relates to apparatus for increasing the dynamic range in an input stage of integrating type in an optoelectric receiver.

Two usual optical input stages are a transimpedance stage and an integrating stage. See, for example, the book Semiconductor Devices for Optical Communications, H. Kressel, Springer-Verlag, Berlin, Heidelberg, New York 1980. Integrating stages are better from the sensitivity aspect, since less noise is generated than in transimpedance stages. Since integrating stages easily become over driven they have, however, poorer dynamic properties than transimpedance stages.

To obtain high sensitivity in a receiver with an integrating input stage, it is sought to obtain low capacitance on its amplifier input. Low capacitance causes a high voltage on the amplifier input since the input signal is integrated. The input stage may therefore be over driven already at a moderate level of the input signal. An integrating stage is very sensitive for overamplification, since the signal information is in the derivative of the integrated signal.

Attempting to connect in extra capacitance electrically on the amplifier input to increase the dynamic range results in deteriorated sensitivity, due to unavoidable stray capacitances in the apparatus used for the connection.

SUMMARY OF THE INVENTION

An object of the invention is to achieve an integrating input step with increased dynamic range and retained sensitivity so that both weak and strong input signals may be detected correctly. The problem is solved by a special feed-back arrangement.

An apparatus in accordance with the invention is thus characterized as is apparent from the accompanying claims.

BRIEF DESCRIPTION OF DRAWING

The invention will now be described in detail with reference to the accompanying drawings, where.

DESCRIPTION OF THE PREFERRED EMBODIMENT

Figure 1:
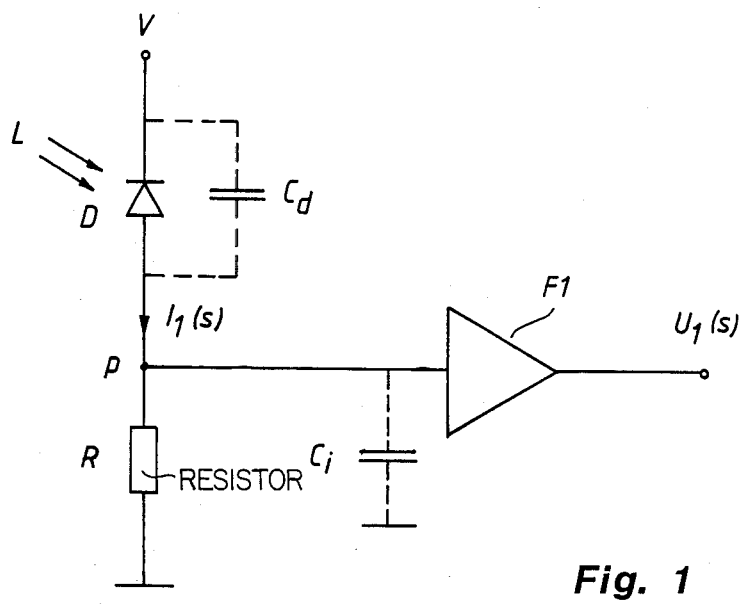
FIG. 1 illustrates a schematic diagram of a conventional integrating input stage.

In the already known input stage according to FIG. 1, an optoelectric converter D, e.g. a photo diode, and a resistor R having a high resistance are connected in series in a supply circuit between a voltage source V and earth. The input to a high impedance amplifier F1 with the gain $-A1$ is connected to a suction point p between the photo diode D and the resistor R. $C_d$ and $C_i$ are capacitances unavoidably associated with the photo diode D and amplifier F1, respectively, these capacitances resulting in an integration operation. The amplifier F1 generates a signal constituting the output singal of the stage.

When light L is incident on the photo diode D, a current proportional to the luminance is generated, this current constituting the electrical input signal of the stage. The resistor R gives the photo diode D an operating point. The resistance is selected as high as possible, which gives little thermal noise and low downward boundary frequency. However, the stage has poor dynamic properties, since, due to the low capacitance, it will be easily over driven on integration.

The transfer function of the stage can be written:

$$H_1(s) = \frac{U_1(s)}{I_1(s)} = -\frac{A1}{s(C_d + C_i) + 1/R}$$

where s denotes the Laplace variable.

Figure 2:
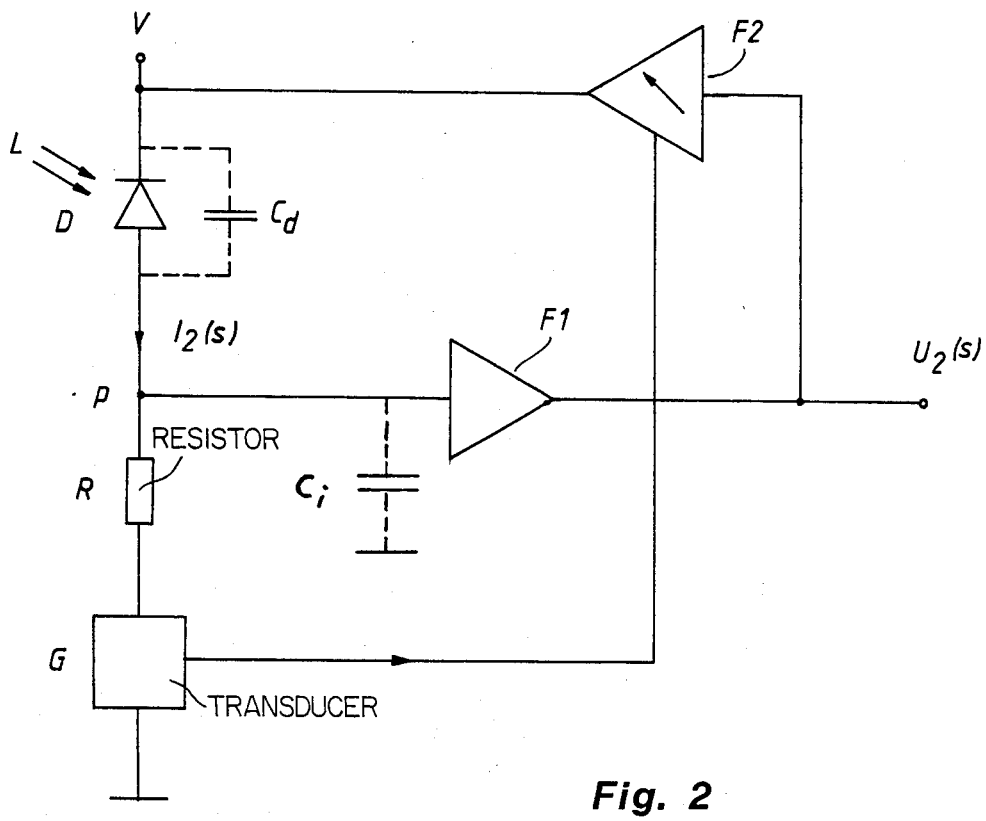
FIG. 2 illustrates an integrating input stage improved in accordance with the invention.

The improved input stage depicted in FIG. 2 differs from the one in the prior art by the use of a feed-back circuit F2 with the transfer function A2, connected between the output stage and the pole of the photo diode D facing away from the input of the amplifier F1. The circuit F2 is shown as a controllable amplifier but may also be a controllable voltage divider. The gain may be regulatable continuously or stepwise, and is controlled by the output signal from a transducer G, the output signal being proportional to the luminance and the transducer being connected in the supply circuit between the resistor R and earth. The transducer may also be connected at other places in the input stage where it generates a signal proportional to the luminance e.g. in another place at the supply circuit or after the amplifier F1.

The feed-back gain is thus varied in proportion to the optical input signal. The effective integrator capacity is then increased from $C_i+C_d$ to $C_i+C_d(1+A1\times A2)$. This is because, according to Miller's theorem, an impedance which is included in the feed-back of an amplifier is seen as an impedance which is $1/(A+1)$ times as large on the input of the amplifier, where A is the inverted voltage gain.

By the feed-back described, the value of the effective capacitance across the photo diode D is increased considerably, while the real vaule remains unaltered.

The transfer function of the improved stage may be written:

$$H_2(s) = \frac{U_2(s)}{I_2(s)} = -\frac{A1}{s[C_i + C_d(1 + A1 \times A2)] + 1/R}$$

For low luminance amplification, A2 is regulated to a negligable value, the transfer function of the stage thus agreeing with the counterpart in a conventional stage. For strong luminance a considerably higher effective capacitance is obtained, however, thus substantially increasing the dynamic range of the stage. On the other hand, the frequncy properties of the stage are not changed within the usable frequency range.

We claim:

1. In an integrating optoelectric receiver having a supply voltage source across which is connected a two-terminal optoelectric converter and an output amplifier having an input connected to one of said terminals having associated therewith stray capacitance and an output which is the output of the receiver, the improvement comprising a controllably variable voltage regulating means connected between the output of said output amplifier and the other terminal of said optoelectric converter, said voltage regulating means having a control input for controlling the magnitude of the regulation, and a transducer means having an output for generating a control signal which is a function of the luminance sensed by said optoelectric converter, and means for connecting the output of said transducer means to the control input of said voltage regulating means.

2. Apparatus as claimed in claim 1, characterized in that the voltage regulating means is continuously controllable.

3. Apparatus as claimed in claim 1, characterized in that the voltage regulating means is stepwise controllable.

4. A wide dynamic range integrating optoelectric receiver comprising: a power supply having first and second terminals; a circuit connected across the terminals of said power supply, said circuit comprising a two-terminaled optoelectric diode, a resistor and a transducer connected in series, said transducer having an output for emitting a control function which is proportional to the current flowing therethrough; an output amplifier having an input connected to the junction of said resistor and one terminal of said diode and an output which is the output of the receiver; and a gain controlled amplifier having an input to the output of said output amplifier, an output connected to the other terminal of said diode, and a control input connected to the output of said transducer.

* * * * *